United States Patent [19]

Brugger

[11] Patent Number: 5,405,797
[45] Date of Patent: Apr. 11, 1995

[54] METHOD OF PRODUCING A MONOLITHICALLY INTEGRATED MILLIMETER WAVE CIRCUIT

[75] Inventor: Hans Brugger, Senden, Germany

[73] Assignee: Daimler-Benz AG, Stuttgart, Germany

[21] Appl. No.: 219,856

[22] Filed: Mar. 30, 1994

Related U.S. Application Data

[62] Division of Ser. No. 76,622, Jun. 15, 1993, abandoned.

[30] Foreign Application Priority Data

Jun. 15, 1992 [DE] Germany .................. 42 19 523.3

[51] Int. Cl.⁶ .......................................... H01L 21/70
[52] U.S. Cl. .................................. 437/51; 437/60; 437/126; 437/133; 437/176
[58] Field of Search ............... 257/195, 192, 194, 193, 257/476; 437/31, 126, 133, 59, 60, 175, 176, 51; 148/DIG. 72

[56] References Cited

U.S. PATENT DOCUMENTS

| | | | |
|---|---|---|---|
| 5,041,393 | 8/1991 | Ahrens et al. | 257/197 |
| 5,104,823 | 4/1992 | Mand | 437/133 |
| 5,104,825 | 4/1992 | Takikawa | 437/133 |
| 5,118,637 | 6/1992 | Ishikawa | 437/133 |
| 5,166,083 | 11/1992 | Bayraktaroglu | 257/197 |
| 5,268,315 | 12/1993 | Prasad et al. | 437/31 |
| 5,294,566 | 3/1994 | Mori | 437/59 |

FOREIGN PATENT DOCUMENTS

| | | | |
|---|---|---|---|
| 0119793 | 9/1984 | European Pat. Off. | |
| 0287793 | 10/1988 | European Pat. Off. | |
| 3712864A1 | 3/1988 | Germany | 257/195 |
| 4101167A1 | 7/1992 | Germany | 257/195 |
| 3129656 | 11/1986 | Japan | 257/195 |

OTHER PUBLICATIONS

Archer, J. A., "Gallium Arsenide MBE Structure Comprising Mixer Diodes and FETs for Monolithic Millimetre-wave Receivers", Electronics Letters, vol. 26, No. 6, Mar. 15, 1990, Stevenage GB, pp. 384–385.

Patent Abstracts of Japan, vol. 12, No. 385 (E–668)(3232), Oct. 14, 1988 (Abstract of JP–A–63 129 656, issued Jun. 2, 1988).

Japanese Journal of Applied Physics (1988) "Novel High-Performance N-AlGaAs/N-AlGaAs/N-AlGaAs Pseudomorphic Double-Heterojunction Modulation-Doped FETs", Katsunori Nishi, et al., vol. 27, No. 11, pp. 2216–2218.

IBM Technical Disclosure Bulletin (1988), "Integrated Schottky Diodes in HBT Technology", vol. 31, No. 5.

Elektronik Produktion & Prüftechnik (1988), "Herstellung und Eigenschaften von monolithisch integrierten Millimeterwellen–Schaltkreisen".

IEEE Transactions on Microwave Theory and Techniques, (1991) "RF Performance of a Novel Planar Millimeter-Wave Diode Incorporating an Etched Surface Channel", vol. 39, No. 1.

"A Fully Monolithic Integrated 60 GHz Receiver", (1989), pp. 185–188.

"Monolithic Integration of Hemts and Schottky Diodes for Millimeter Wave Circuits", (1988), pp. 301–304.

Primary Examiner—Brian E. Hearn
Assistant Examiner—Tuan Nguyen
Attorney, Agent, or Firm—Spencer, Frank & Schneider

[57] ABSTRACT

A method and an arrangement for an integrated millimeter wave circuit wherein a Schottky diode and an HFET are produced in a quasi-planar arrangement from a semiconductor layer sequence. Due to the quasi-planar arrangement, the manufacturing process is simplified since particularly the contact regions of the Schottky diode and the HFET are produced simultaneously.

8 Claims, 1 Drawing Sheet

METHOD OF PRODUCING A MONOLITHICALLY INTEGRATED MILLIMETER WAVE CIRCUIT

This application is a Division of application Ser. No. 08/076,622, filed Jun. 15, 1993, now abandoned.

REFERENCE TO RELATED APPLICATIONS

This application claims the priority of Federal Republic of Germany application Serial No. P 42 19 523.3 filed Jun. 15th, 1992, which is incorporated herein by reference.

BACKGROUND OF THE INVENTION

The present invention relates to an integrated circuit composed of a semiconductor layer sequence that is grown on a semi-insulating substrate and includes at least one Schottky diode as well as at least one heterostructure field effect transistor (HFET), and to a method of producing such an integrated circuit.

The invention is used in the millimeter wave communications art and in the sensor art as well as in radar, traffic control and satellites.

In communications and sensor systems, a further raise of the operating frequencies into the millimeter wavelength range brings about improved beam characteristics and increased resolution. Of particular interest in this connection are frequencies in the range of the atmospheric windows at 94 GHz, 140 GHz and 220 GHz for communications systems and the absorptions bands created by oxygen and water in the frequency ranges therebetween for short-range systems. However, this requires integrated circuits that have the appropriate gain, noise and mixer characteristics in the millimeter wavelength range, the so-called MMIC's (monolithically integrated millimeter wavelength circuits). The individual components must therefore always have higher cutoff frequencies and a suitable high frequency behavior.

It is known to manufacture electronic components for high operating frequencies (ultra-high frequency components) from semiconductor starting materials which were produced by epitaxial growth methods, e.g., a MBE process or a CVD process. The epitaxy causes different layers that determine the function of the component to be precipitated on a substrate. These layers are structured by means of lithographic processes (photo- and electron beam lithography) and etching processes (wet and dry chemical processes).

It is also known for a system of GaAs materials to produce semi-insulating regions in previously conductive layers by bombarding them with boron ions or protons, and to produce n-conductive regions in previously semi-insulating regions by bombarding them with silicon ions and subsequent short-term healing during the production of semiconductors.

Developments in recent years have shown that the thus far highest amplifier cutoff frequencies can be realized with heterostructure field effect transistors (HFET's). For uses in the millimeter wavelength range, the HFET is superior to conventional components, particularly the MESFET component, primarily in its noise behavior and in its high frequency amplifying characteristics. Moreover, due to its physical mode of operation, an HFET is usable for cryogenic applications down to very low temperatures.

For operating frequencies far into the sub-millimeter wavelength range, GaAs Schottky diodes have at present the best mixer characteristics for room temperature applications (see D. G. Garfield, R. J. Mattauch and S. Weinreb, "RF Performance of a Novel Planar Millimeter-Wave Diode Incorporating an Etched Surface Channel," in IEEE Transactions on Microwave Theory and Techniques 39 (1), 1991, pages 1–5, and the references cited therein).

With a monolithically integrated structure of an electronic system, parasitic losses, particularly at the interfaces between the various components can be minimized. In addition, installation costs can be noticeably lowered due to the small amount of hybrid configuration technology employed.

One method of producing planar MMIC's of GaAs MESFET's and Schottky diodes for operating frequencies below 100 GHz is disclosed by A. Colquhoun, G. Ebert, J. Selders, B. Adelseck, J. M. Dieudonne, K. E. Schmegner, and W. Schwab, "A Fully Monolithic Integrated 60 GHz Receiver," in Proceedings of the Gallium Arsenide IC Symposium, 1989, San Diego, Calif., pages 185–188.

A formulation for the integration of HFET's with Schottky diodes in a non-planar geometry was published by W. J. Ho, E. A. Sovero, D. S. Deadin, R. D. Stein, G. J. Sullivan, and J. A. Higgens, in an article entitled "Monolithic Integration of HEMT's and Schottky Diodes for Millimeter Wave Circuits," Rec. of the IEEE GaAs Integrated Circuits Symposium, 1988, pages 139–242. This involves epitaxially stacking an n+nn+ GaAs diode layer sequence on an AlGaAs/GaAs layer sequence for the HFET. A prerequisite for the realization of the highest diode cutoff frequencies, however, is a very low parasitic resistance and a low capacitance which can be realized only with very thick n+ lead layers (typically at least in a range around 1 $\mu$m) and an active layer having a thickness between 0.5 $\mu$m and 1 $\mu$m (see D. G. Garfield et al, IEEE Transactions on Microwave Theory and Techniques 39 (1), 1991, pages 1–5). Thus there is an unavoidably great difference in height between the diode and the HFET in the proposed structure. The non-planarity makes the engineering of the process of manufacturing the circuit considerably more difficult.

SUMMARY OF THE INVENTION

It is an object of the present invention to provide an integrated circuit for the millimeter wavelength range and a method of producing it in which the arrangement of the semiconductor elements permits simplified manufacture.

The above object is achieved according to the aspect of the present invention by an integrated circuit comprising a semiconductor layer sequence grown on a substrate and including at least one Schottky diode and at least one heterostructure field effect transistor (HFET); wherein: the semiconductor layer sequence is composed of a first layer sequence for a Schottky diode and a planar second layer sequence for an HFET grown on the first layer sequence; the second layer sequence of the HFET has only a thin buffer layer; between the buffer layer of the second layer sequence for the HFET and the first layer sequence of the Schottky diode, a further semiconductor layer is provided which is configured as an etch-stop layer, a desorption-stop layer and also as a barrier for the charge carriers of the HFET; and the Schottky diode and the HFET are arranged in a quasi-planar arrangement with the second layer sequence and the further layer being removed from the portion of the first layer sequence containing the Schottky diode.

Preferably, wherein the substrate and the semiconductor layer sequence are composed of III/V semiconductor material, the operating frequency of the circuit lies in the millimeter wavelength range, the Schottky diode is constructed of GaAs, and the HFET is composed of a pseudomorphic AlGaAs/InGaAs/GaAs layer sequence or an AlGaAs/GaAs layer sequence. Additionally, the further layer is an Al containing layer, e.g. of AlAs or AlGaAs and has a thickness of about 10 nm, the buffer layer has a thickness less than 100 nm, and the portion of the first layer sequence below the second layer sequence is doped to convert same to semi-insulating material.

The above object is achieved according to a further aspect of the invention by a method of producing an integrated circuit including at least one HFET and at least one Schottky diode, comprising the steps of: epitaxially growing a first semiconductor layer sequence for a Schottky diode on a semi-insulating substrate; subsequently precipitating an undoped further semiconductor layer, which is configured as an etch-stop layer, a desorption stop layer and a charge carrier barrier for the HFET, on the first semiconductor layer sequence; covering the undoped further semiconductor layer with a thin undoped passivation layer; subsequently producing, in a photolithographic process, a mask on the surface of the passivation layer for the first semiconductor layer sequence, which mask covers that part of the first semiconductor layer sequence from which the Schottky diode is to be produced; converting the semiconductor material of the electrically conductive Schottky diode layers in the window regions of the mask by into semi-insulating material by selective insulation implantation via the window regions of the mask; thereafter removing the mask and the passivation layer; growing a pseudomorphic second semiconductor layer sequence for the HFET on the undoped further semiconductor layer in a second epitaxy process; selectively etching away the second semiconductor layer sequence of the HFET in the region of the first semiconductor layer sequence from which the Schottky diode is to be produced; selectively removing the undoped further semiconductor layer in the region of the Schottky diode; and producing the contact regions for the Schottky diode and for the HFET simultaneously.

Preferably, the first semiconductor layer sequence is provided by epitaxially growing a buffer layer of an undoped GaAs layer, an AlGaAs/GaAs superlattice and an undoped GaAs layer on a GaAs semi-insulating substrate to a total thickness in a range from about 0.5 μm to 1 μm; and then growing the following semiconductor layer sequence on the buffer layer: an n+-doped GaAs layer having a dopant concentration in a range from $5 \times 10^{18}$ to $1 \times 10^{19}$ cm$^{31\ 3}$ and a layer thickness in a range from 0.4 μm to 0.6 μm; an n-doped GaAs layer of a thickness in a range from 0.2 μm to 1 μm and a dopant concentration in a range from 1 to $5 \times 10^{17}$ cm$^{-3}$; and an n+-doped GaAs layer having a dopant concentration of at least $5 \times 10^{18}$ cm$^{-3}$ and a thickness of about 30 nm.

Moreover, according to the preferred embodiment of the invention, the undoped further layer is formed of undoped AlAs or AlGaAs to a thickness of about 10 nm, and the second semiconductor layer sequence for the HFET is epitaxially produced from: an undoped buffer layer of GaAs having a thickness of about 40 nm; an undoped InGaAs layer having a thickness of about 10 nm and an In content of about 20%; an undoped spacer layer composed of a GaAs/AlGaAs heterostructure and having an Al content of about 25% and a thickness of about 3 nm; a modulation doped AlGaAs layer having a homogeneous or pulse-shaped dopant concentration of about $3 \times 10^{18}$ cm$^{-3}$ and a layer thickness of about 30 nm; and an n+-doped GaAs cover layer having a dopant concentration of at least $5 \times 10^{18}$ cm$^{-3}$ and a layer thickness of about 30 nm. Moreover, the selective insulation implantation preferably is effected with oxygen, and passivation layer applied to the undoped further semiconductor layer is thermally removed under arsenic pressure.

The invention will be described below in greater detail with reference to an embodiment thereof that is illustrated in schematic drawing figures.

DETAILED DESCRIPTION OF THE PREFERRED EMBODIMENTS

One advantage of the invention lies in the combination of HFET and Schottky diode in integrated configuration, since this minimizes parasitic losses, particularly at the interfaces between the components. With the integrated circuit layer structure according to the invention, a diode and a transistor can be optimized independently for the desired characteristics.

Another advantage is that the quasi-planar arrangement of the Schottky diode and the HFET permits the simplified and parallel manufacture of the contact regions for both components in a technologically compatible manner. In particular, the gate manufacturing process is performed simultaneously for both components. Preferably, a low-ohmic mushroom or T-gate contact in multi-finger arrangement is employed for the Schottky contact.

With pseudomorphic HFET's that are disposed on semi-insulating GaAs substrates of III/V semiconductor compounds and have potential wells of InGaAs and cutoff frequencies above 200 GHz, and with Schottky diodes having cutoff frequencies far in the THz range, millimeter wavelength circuits are realized with which low-noise millimeter wave receiver front ends can be produced in integrated form, for example on a GaAs substrate, equipped with an antenna, low-noise pre-amplifier, diode mixer, low-noise IF amplifier, voltage controlled varactor diodes, HFET oscillator and passive components.

The invention will now be described in greater detail for one embodiment thereof.

Figure 1:
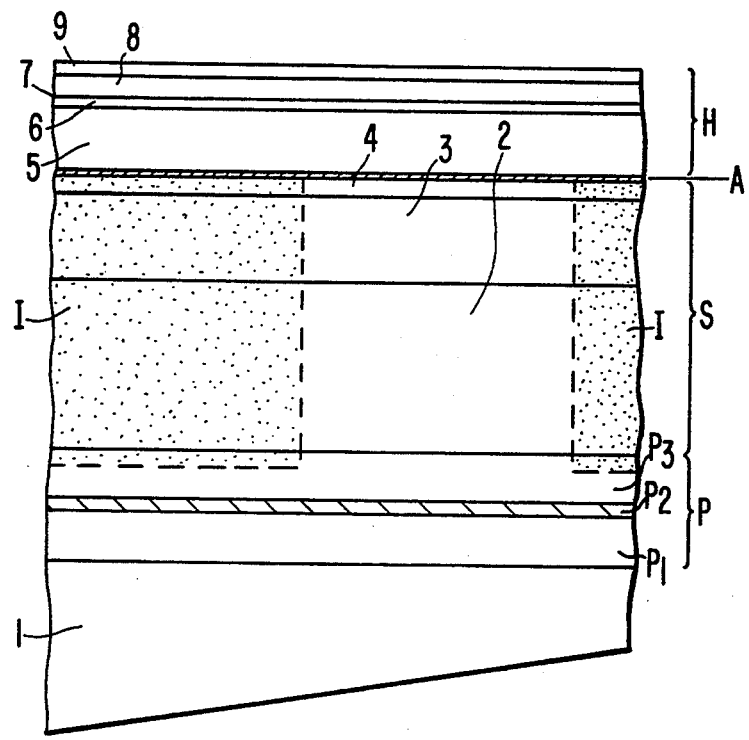
FIG. 1 is a sectional view showing the semiconductor layer structure for an integrated circuit according to a preferred embodiment of the invention.

As shown in FIG. 1, a semi-insulating GaAs wafer is employed as the substrate 1. With the aid of an epitaxy method, preferably molecular beam epitaxy, a buffer layer P of undoped GaAs material $P_1$, an AlGaAs/GaAs superlattice $P_2$ and undoped GaAs material $P_3$ is initially produced in a first epitaxy step. Buffer layer P, for example, has an overall thickness in a range from 0.5 82 m to 1 μm. Then the silicon doped GaAs layer sequence S for the Schottky diode is precipitated a follows:

a thick, low-ohmic n+ layer 2 as the buried diode lead with a high dopant concentration, preferably in a range between $5 \times 10^{18}$ cm$^{-3}$ and $1 \times 10^{19}$ cm$^{-3}$ to realize layer resistances in a range of 10 Ω/sq, with an exemplary layer thickness in a range from 0.4 μm to 0.6 82 m;

an active layer 3 whose thickness and dopant concentration is adapted to the required component specifications, particularly in order to realize low series resistances and low barrier layer capacitances, for example in a layer thickness in a range from 0.2 μm to 1 μm and with a dopant concentration in a range from 1 to $5 \times 10^{17}$ cm$^{-3}$; and a thin, highly doped layer 4 for well conducting ohmic contacts, with the layer having, for example, a thickness of 30 nm and a dopant concentration of at least $5 \times 10^{18}$ cm$^{-3}$.

Thereafter, a thin, undoped Al-containing layer A is precipitated, preferably of AlAs or AlGaAs, which acts as an etch stop layer for the technological production of the desired layer sequence, as a desorption stop layer for the epitaxy, and as a rear electron barrier for the HFET component. Layer A has, for example, a thickness of 10 nm. Finally, the surface of layer A is passivated with a thin, undoped GaAs layer (not shown), for example of a thickness of 50 nm.

The thus far produced epitaxial wafer is provided, in a further ex-situ technology step, with a masking layer (not shown), preferably a dielectric layer, e.g., SiO$_2$, SiON, and windows are formed in this dielectric layer by means of a photolithographic process. The resulting mask serves as an implantation mask for selective insulation implantation. Then the wafer is implanted through the above-mentioned mask layer with an element, preferably oxygen, that, due to its lattice structure, additionally acts to isolate defects and also as an electronic insulator and retains this behavior up to high temperatures. The implantation profile is selected to be such that the n+nn+ Schottky diode layers 2–4 that were previously conductive in the window regions are compensated again and, together with a healing step to be performed later, semi-insulating material I as indicated by the stippled regions is again produced.

The dielectric layer then is removed by etching and the wafer is prepared for a second epitaxy step. Due to this lateral structuring, the selective and buried path regions for the later Schottky diode are produced in a "negative process". As an alternative, a "positive process" may be employed in which a buried conductor path is produced in the substrate by selective Si implantation and a subsequent high temperature healing process. Thereafter, the semiconductor layers for the nn+ Schottky diode (3,4), the layer A and HFET can be grown in an epitaxy process. With this variation, the first epitaxy step (layer 2) is not required, but the resulting layer conductivities are noticeably lower and, compared to the "negative process," the surface morphology is worsened by the high temperature healing step.

In another process, the wafer is heated within the epitaxy system to a desorption temperature, preferably above the epitaxy temperature but below the surface degradation temperature, and the natural oxide layer as well as the passivation layer are thermally removed under arsenic pressure. Layer A serves as a desorption stopper. Thus, a microscopically smooth surface of layer A is exposed in situ for the second epitaxy step. At the same time, crystal defects are healed, the implant is activated electronically and semi-insulating implanted regions I are created. As an alternative, a thin passivation layer, for example of 10 nm, can be selected and the epitaxy wafer heated only to a temperature at which the natural oxide is desorbed under arsenic local pressure. In this process, the wafer is subjected only to low temperatures of, typically, below 600° C. and the implanted regions exhibit semi-insulating behavior, primarily because of defect isolation.

Thereafter, as shown in FIG. 1, the pseudomorphic HFET layer sequence H is precipitated. Layer sequence H is preferably composed of an undoped GaAs buffer layer 5, a pseudomorphic InGaAs quantum well 6, a spacer layer 7, a modulation doped AlGaAs layer 8 and a terminating, highly doped GaAs cover layer 9 for the ohmic contacts. Layer sequence H is distinguished by the fact that the GaAs buffer layer 5 is applied directly to layer A and its layer thickness is selected to be thin, preferably in a range of less than 100 nm. Thus the height of the HFET component is limited to a range in the order of magnitude of 0.1 μm. Due to the great discontinuity of the conduction bands, layer A on the rear face, in addition to the InGaAs quantum well 6, acts as an electron barrier for hot charge carriers in the channel and results in an improvement in the output conductance.

As an alternative, the InGaAs quantum well 6 can be omitted in the HFET layer sequence. However, the resulting cutoff frequencies and currents are then not as high.

The thicknesses of the highly doped GaAs cover layer 9 and the active GaAs layer 3 of the diode are adapted to the thicknesses of the highly doped GaAs cover layer 9 and the modulation doped AlGaAs layer 8 of the HFET in such a way that the gate recess process for both components can be performed simultaneously and the component specifications can be met.

Layer sequence H is composed, for example, of:

an undoped buffer layer 5 of GaAs having a thickness of 40 nm;

an undoped InGaAs layer 6 having a thickness of 10 nm and an In content of 20%;

an undoped GaAs/AlGaAs heterostructure spacer layer 7 having an Al content of 25% and a thickness of 3 nm;

a modulation doped AlGaAs layer 8 having a homogeneous or pulse-shaped dopant concentration of $3 \times 10^{18}$ cm$^{-3}$ and a thickness of 30 nm; and a GaAs cover layer 9 having a dopant concentration of at least $5 \times 10^{18}$ cm$^{-3}$ and a thickness of 30 nm.

Figure 2:
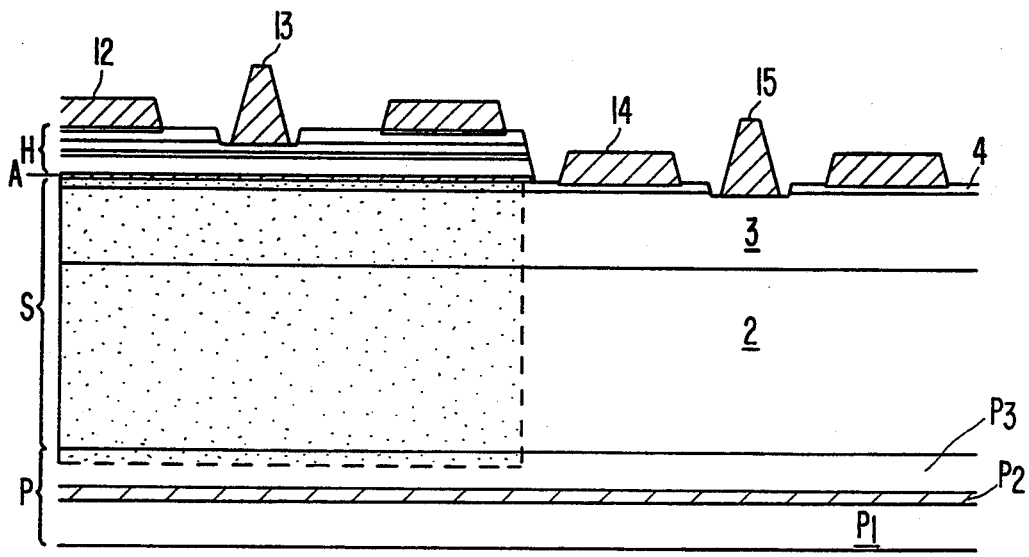
FIG. 2 shows an arrangement of a Schottky diode and an HFET on a semi-insulating substrate with the layer structure of FIG. 1.

For the production of the component, and as can be seen in FIG. 2, the HFET layer sequence 5–9 is removed with the aid of a photolithographic process and with a known selective etching process at those locations where Schottky diode components are to be provided, with the selective etching process stopping at layer A. Then a selective etching process is employed which removes layer A and stops at the GaAs surface of diode layer sequence S. Thereafter, the ohmic contact regions for both components are defined and produced by means of a photolithography process. By means of, for example, an electron beam lithography process, the Schottky contact regions are defined for both components. Then recessed troughs 10 and 11 for the HFET and the Schottky diode, respectively are produced with an etching process, and the metal contacts 12, 13 for the HFET and 14, 15 for the diode are realized by a vapor-deposition process.

The HFET may not only be configured, as described in the embodiment, as a field effect transistor doped on only one side, instead an HFET that is doped on both sides can also be employed, that is, a highly doped layer is disposed above and below the channel layer carrying the two-dimensional electron gas.

The invention is also not limited to the materials mentioned in the embodiment, instead, for example, HFET and Schottky diode layer sequences that are based on InP substrates or SiGe HFET and Schottky diode layer sequences based on Si substrates may also be employed. Furthermore, it is possible to also employ a p-doped HFET instead of the n-modulation doped HFET.

The invention now being fully described, it will be apparent to one of ordinary skill in the art that any changes and modifications can be made thereto without departing from the spirit or scope of the invention as set forth herein.

What is claimed is:

1. A method of producing an integrated circuit including at least one HFET and at least one Schottky diode, comprising the following steps:
   epitaxially growing a first semiconductor layer sequence for a Schottky diode on a semi-insulating substrate;
   subsequently precipitating an undoped further semiconductor layer, which is configured as an etch-stop layer, a desorption stop layer and a charge carrier barrier for the HFET, on Said first semiconductor layer sequence.
   covering the undoped further semiconductor layer with a thin undoped passivation layer;
   subsequently producing, in a photolithographic process, a mask on the surface of the passivation layer for the first semiconductor layer sequence, which mask covers that part of said first semiconductor layer sequence from which the Schottky diode is to be produced;
   converting the semiconductor material of the electrically conductive Schottky diode layers in the window regions of the mask into semi-insulating material by selective insulation implantation via the window regions of the mask;
   thereafter removing the mask and the passivation layer;
   growing a pseudomorphic second semiconductor layer sequence for the HFET on the undoped further semiconductor layer in a second epitaxy process;
   selectively etching away the second semiconductor layer sequence of the HFET in the region of the first semiconductor layer sequence from which the Schottky diode is to be produced;
   selectively removing the undoped further semiconductor layer in the region of the Schottky diode; and
   producing the contact regions for the Schottky diode and for the HFET simultaneously.

2. A method as defined in claim 1, further comprising epitaxially growing a buffer layer of an undoped GaAs layer, an AlGaAs/GaAs superlattice and an undoped GaAs layer on the semi-insulating substrate, which is formed of GaAs, to a total thickness in a range from 0.5 $\mu$m to 1 $\mu$m; and wherein said first semiconductor layer sequences is grown on said buffer layer and is composed of:
   an n+-doped GaAs layer having a dopant concentration in a range from $5 \times 10^{18}$ to $1 \times 10^{19}$ cm$^{-3}$ and a layer thickness in a range from 0.4 $\mu$m to 0.6 $\mu$m;
   an n-doped GaAs layer of a thickness in a range from 0.2 $\mu$m to 1 $\mu$m and a dopant concentration in a range from 1 to $5 \times 10^{17}$ cm$^{-3}$; and
   an n+-doped GaAs layer having a dopant concentration of at least $5 \times 10^{18}$ cm$^{-3}$ and a thickness of about 30 nm.

3. A method as defined in claim 1, wherein said undoped further layer is formed of undoped AlAs or AlGaAs to a thickness of about 10 nm.

4. A method as defined in claim 1, wherein the second semiconductor layer sequence for the HFET is epitaxially produced from:
   an undoped buffer layer of GaAs having a thickness of about 40 nm;
   an undoped InGaAs layer having a thickness of about 10 nm and an In content of about 20%;
   an undoped spacer layer composed of a GaAs/AlGaAs heterostructure and having an Al content of about 25% and a thickness of about 3 nm;
   a modulation doped AlGaAs layer having a homogeneous or pulse-shaped dopant concentration of about $3 \times 10^{18}$ cm$^{-3}$ and a layer thickness of about 30 nm; and
   an n+-doped GaAs cover layer having a dopant concentration of at least $5 \times 10^{18}$ cm$^{-3}$ and a layer thickness of about 30 nm.

5. A method as defined in claim 12, wherein the selective insulation implantation is effected with oxygen.

6. A method as defined in claim 1, wherein the passivation layer applied to the undoped further semiconductor layer is thermally removed under arsenic pressure.

7. A method as defined in claim 1, wherein the thin passivation layer applied to the undoped further semiconductor layer is not removed and the epitaxial wafer including the first semiconductor layer sequence is held at a temperature below 600° C. during subsequent processing.

8. A method of producing an integrated circuit as defined in claim 1, comprising:
   producing a buried n+-conductor path in a semi-insulating substrate by selective Si implantation and a subsequent healing process; and
   thereafter, in at least one epitaxy process, precipitating an active n-semiconductor layer and an n+-contact layer of the Schottky diode on the substrate, said further semiconductor layer on said n+-contact layer, and said second layer sequence for the HFET on said further semiconductor layer.

* * * * *